(12) United States Patent
Suzuki et al.

(10) Patent No.: US 6,828,844 B2
(45) Date of Patent: Dec. 7, 2004

(54) MIXER WHICH ASSURES SATISFACTORY PERFORMANCE EVEN AT LOW SUPPLY VOLTAGE

(75) Inventors: Takeo Suzuki, Fukushima-ken (JP); Osamu Tatsumi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/628,213

(22) Filed: Jul. 28, 2003

(65) Prior Publication Data

US 2004/0027188 A1 Feb. 12, 2004

(30) Foreign Application Priority Data

Aug. 7, 2002 (JP) ........................................ 2002-230444

(51) Int. Cl.[7] .............................. H04B 1/28; G06G 7/12
(52) U.S. Cl. ........................................ 327/359; 455/326
(58) Field of Search ................................. 327/355–361; 330/252; 455/318–319, 323, 326, 333

(56) References Cited

U.S. PATENT DOCUMENTS 5,933,771 A * 8/1999 Tiller et al. ................. 455/333
6,239,645 B1 * 5/2001 Tsukahara et al. .......... 327/359
6,335,651 B1 * 1/2002 Fayyaz ....................... 327/359
6,348,830 B1 * 2/2002 Rebeiz et al. ............... 327/355
6,396,330 B1 * 5/2002 Fujii .......................... 327/355
6,411,801 B1 * 6/2002 Kim et al. .................. 455/333
6,529,721 B1 * 3/2003 Tiller ......................... 455/323
6,631,257 B1 * 10/2003 White et al. ................ 455/333
6,665,527 B2 * 12/2003 Schiltz ....................... 455/326

FOREIGN PATENT DOCUMENTS

JP          05-114823          5/1993

* cited by examiner

Primary Examiner—My-Trang Nuton
(74) Attorney, Agent, or Firm—Brinks Hofer Gilson & Lione

(57) ABSTRACT

A mixer has a first transistor and a second transistor which constitute a balanced oscillation circuit with their respective emitters connected with each other; a third transistor whose emitter is connected with the emitter of the first transistor; and a fourth transistor whose emitter is connected with the emitter of the second transistor. A first signal is inputted between a base of the third transistor and a base of the fourth transistor in a balanced way; and the third transistor and the fourth transistor mix an oscillation signal with the first signal and a second signal is outputted from the third transistor and the fourth transistor in a balanced way.

6 Claims, 2 Drawing Sheets

MIXER WHICH ASSURES SATISFACTORY PERFORMANCE EVEN AT LOW SUPPLY VOLTAGE

BACKGROUND OF THE INVENTION

1. Field of the Invention

The present invention relates to a mixer which is used in a frequency converter, a modulator or the like.

2. Description of the Related Art

The conventional mixer as shown in FIG. 3 is called the Gilbert mixer and widely used in frequency converters and the like. As illustrated in FIG. 3, a first differential amplifier circuit 21 and a second differential amplifier circuit 22 are connected in a balanced way by a third differential amplifier circuit 23. Specifically, the emitters of a pair of transistors 21a and 21b which constitute the first differential amplifier circuit 21 are connected with each other and also connected with the collector of one transistor 23a in a pair of transistors which constitute the third differential amplifier circuit 23; and the emitters of a pair of transistors 22a and 22b which constitute the second differential amplifier circuit 22 are connected with each other and also connected with the collector of the other transistor 23b in the pair of transistors which constitute the third differential amplifier circuit 23. The emitters of the transistors 23a and 23b in the third differential amplifier circuit 23 are connected with each other and also connected with a constant current source 24.

The collector of the one transistor 21a in the first differential amplifier circuit 21 and the collector of the one transistor 22a in the second differential amplifier circuit 22 are connected with one balanced output terminal 25 and supply voltage B is fed to them through a common load resistor 26. Also, the collector of the other transistor 21b in the first differential amplifier circuit 21 and the collector of the other transistor 22b in the second differential amplifier circuit 22 are connected with the other balanced output terminal 28 and supply voltage B is fed to them through a common load resistor 29.

The base of the one transistor 21a in the first differential amplifier circuit 21 and the base of the other transistor 22b in the second differential amplifier circuit 22 are connected with each other and also with one balanced input terminal 30. The base of the other transistor 21b in the first differential amplifier circuit 21 and the base of the one transistor 22a in the second differential amplifier circuit 22 are connected with each other and also with the other balanced input terminal 31.

Also, the bases of the transistors 23a and 23b in the third differential amplifier circuit 23 are respectively connected with the first balanced input terminals 32 and 33.

In the above configuration, a first signal, for example a high frequency signal, is inputted between the first balanced input terminals 32 and 33 in a balanced way; and a second signal, for example a local oscillation signal, is inputted between the second balanced input terminals 30 and 31. Consequently, an intermediate frequency signal as a result of frequency conversion is outputted between the balanced output terminals 25 and 28. A tuning circuit (not shown) is connected between the balanced output terminals 25 and 28.

The local oscillation signal as the first signal is supplied, for example, from a balanced type oscillation circuit as illustrated in FIG. 4. In this circuit, a pair of oscillation transistors 41 and 42 share one resonant circuit 43 which is connected between their respective collectors and bases, and a local oscillation signal is outputted between the collectors in a balanced way.

In the above conventional mixer, supply voltage is serially fed to the first and second differential amplifier circuits 21 and 22 and the third differential amplifier circuit 23 and therefore the voltage applied to each differential amplifier circuit is about one half the supply voltage. Accordingly, this voltage drop may cause mixer performance deterioration.

Most mixers use integrated circuits (IC). The latest type integrated circuits are designed to operate at low voltage, so the influence of supply voltage on the mixer performance is considerable.

Furthermore, the conventional mixer requires peripheral circuits such as oscillation circuits and resonant circuits, which makes the overall structure of the mixer complicated.

SUMMARY OF THE INVENTION

The present invention has been made in view of the above circumstances and provides a mixer which assures satisfactory performance even at low supply voltage and has a simple overall structure including peripheral circuits.

In order to solve the above problem, according to one aspect of the present invention, the mixer comprises: first and second transistors which constitute a balanced oscillation circuit with their respective emitters connected with each other; a third transistor whose emitter is connected with the emitter of the first transistor; and a fourth transistor whose emitter is connected with the emitter of the second transistor, wherein a first signal is inputted between a base of the third transistor and a base of the fourth transistor in a balanced way; and the third transistor and the fourth transistor mix an oscillation signal with the first signal and a second signal is outputted from the third transistor and the fourth transistor in a balanced way.

According to another aspect of the invention, the mixer has a first parallel resonant circuit which determines an oscillation frequency and a second parallel resonant circuit which resonates with the second signal; the first parallel resonant circuit is connected between a collector and the base of each of the first and second transistors; and the second parallel resonant circuit is connected between a collector of the third transistor and a collector of the fourth transistor.

According to another aspect of the invention, the first parallel resonant circuit is made up of a first capacitor, and first and second inductors which are serially connected with each other and connected in parallel with the first capacitor; and a point of connection between the first capacitor and the first inductor is connected with the collector of the first transistor; a point of connection between the first capacitor and the second inductor is connected with the collector of the second transistor. Also, the second parallel resonant circuit is made up of a second capacitor, and third and fourth inductors which are serially connected with each other and connected in parallel with the second capacitor; a point of connection between the second capacitor and the third inductor is connected with the collector of the third transistor; a point of connection between the second capacitor and the fourth inductor is connected with the collector of the fourth transistor. Here, supply voltage is fed to a point of connection between the first inductor and the second inductor and a point of connection between the third inductor and the fourth inductor.

According to another aspect of the invention, the mixer includes a composite resonant circuit which has parallel resonance frequencies in the respective vicinities of an oscillation frequency and the second signal, wherein the collector of the first transistor and the collector of the third transistor are connected with each other and the collector of the second transistor and the collector of the fourth transistor are connected with each other. The composite resonant circuit is connected between the collectors of the first and third transistors and the base of the second transistor as well as between the collectors of the second and fourth transistors and the base of the first transistor.

According to another aspect of the invention, the composite resonant circuit includes a first capacitor; a serial circuit which has a second capacitor, and first and second inductors and is connected in parallel with the first capacitor with the second capacitor located between the first and second inductors; and third and fourth inductors which are serially connected with each other and connected in parallel with the second capacitor. The first and second capacitors and the first and second inductors generate parallel resonance in the vicinity of the oscillation frequency and the second capacitor and the third and fourth inductors generate parallel resonance in the vicinity of the second signal frequency. The point of connection between the first capacitor and the first inductor is connected with the collectors of the first and third transistors and the point of connection between the first capacitor and the second inductor is connected with the collectors of the second and fourth transistors. Here, supply voltage is fed to the point of connection between the third and fourth inductors.

According to another aspect of the invention, the second signal is outputted from both ends of the second capacitor.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
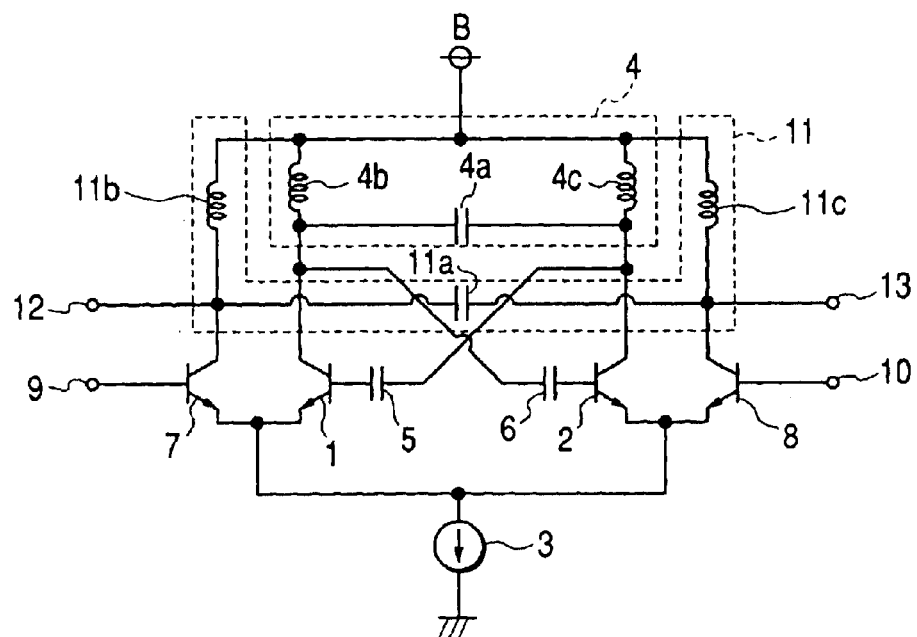
FIG. 1 is a circuit diagram showing a mixer according to a first embodiment of the present invention.

Next, a mixer according to the present invention will be described referring to the accompanying drawings. In the circuit as shown in FIG. 1 according to the first embodiment, the emitter of a first transistor 1 and the emitter of a second transistor 2 are connected with each other and also both connected with a constant current source 3 or the like. A first parallel resonant circuit 4 is connected between the collector and base of each of the transistors 1 and 2. Hence, the two transistors 1, 2 and the first parallel resonant circuit 4 make up a balanced oscillation circuit. The first parallel resonant circuit 4 includes a first capacitor 4a and a first inductor 4b and a second inductor 4c which are serially connected with each other and in parallel with the first capacitor 4a. The oscillation frequency depends on this resonance frequency.

The inductance of the first inductor 4b is almost equal to that of the second inductor 4c. The point of connection between the first capacitor 4a and the first inductor 4b is connected with the collector of the first transistor 1 and the point of connection between the first capacitor 4a and the second inductor 4c is connected with the collector of the second transistor 2. Hence, supply voltage B applied to the point of connection between the two inductors 4b and 4c is fed to the collectors of the transistors 1 and 2. The bases of the transistors 1 and 2 are connected with the first parallel resonant circuit 4 through coupling capacitors 5 and 6.

The emitter of the first transistor 1 is connected with the emitter of the third transistor 7 and the emitter of the second transistor 2 is connected with the emitter of the fourth transistor 8. The base of the third transistor 7 is connected with one balanced input terminal 9 and the base of the fourth transistor 8 is connected with the other balanced input terminal 10. A second parallel resonant circuit 11 is connected between the collector of the third transistor 7 and that of the fourth transistor 8. The collector of the third transistor 7 is connected with one balanced output terminal 12 and the collector of the fourth transistor 8 is connected with the other balanced output terminal 13.

The second parallel resonant circuit 11 includes a second capacitor 11a and a third inductor 11b and a fourth inductor 11c which are serially connected with each other and in parallel with the second capacitor 11a. The inductance of the third inductor 11b is equal to that of the fourth inductor 11c. The point of connection between the second capacitor 11a and the third inductor 11b is connected with the collector of the third transistor 7 and the point of connection between the second capacitor 11a and the fourth inductor 11c is connected with the collector of the fourth transistor 8. Hence, supply voltage B applied to the point of connection between the two inductors 11b and 11c is fed to the collectors of the transistors 7 and 8.

In the above configuration, for instance, a high frequency signal to be frequency converted is inputted between the balanced input terminals 9 and 10. As a result, the third transistor 7 and the fourth transistor 8 operate differentially. The first transistor 1 and the second transistor 2, which constitute a balanced oscillation circuit, also operate differentially. The emitter of the third transistor 7 and the emitter of the fourth transistor 8 are excited in reverse phases by an oscillation signal. Hence, in the third transistor 7 and the fourth transistor 8, the oscillation signal and the first signal are mixed and, for example, a second signal whose frequency is the difference between the frequencies of the oscillation and first signals, namely an intermediate frequency signal, is generated. When the resonance frequency of the second parallel resonant circuit 11 is set to the value of the difference, an intermediate frequency signal as the second signal is efficiently outputted from the balanced output terminals 12 and 13 in a balanced way.

In the above configuration, supply voltage B is fed in parallel to the two transistors 1 and 2, which constitute a balanced oscillation circuit, and the two transistors 7 and 8, which mix signals; thus the mixer operates satisfactorily even at low voltage.

Figure 2:
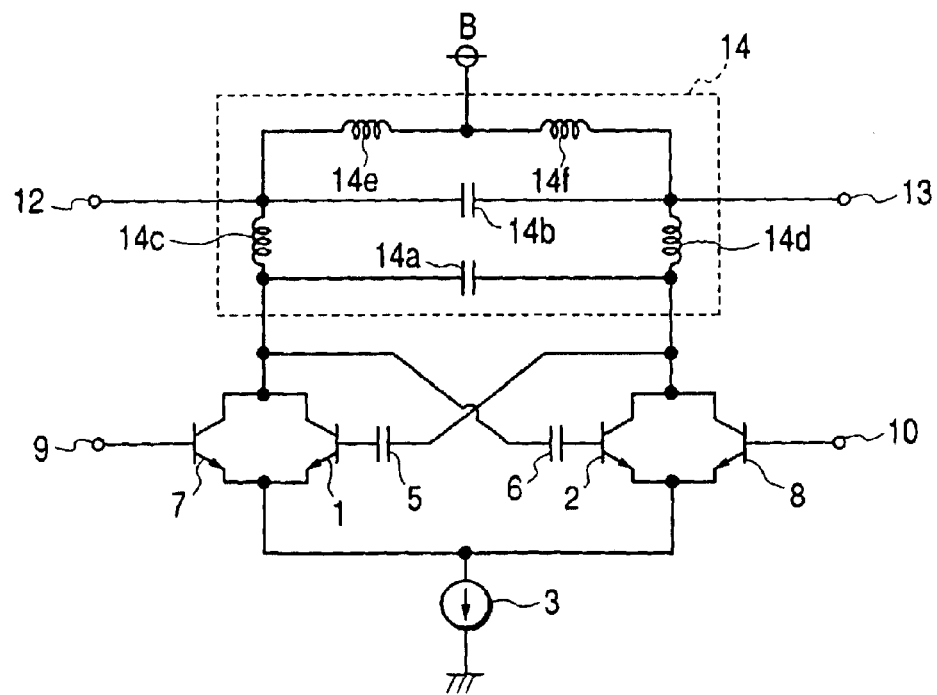
FIG. 2 is a circuit diagram showing a mixer according to a second embodiment of the present invention.
Figure 3:
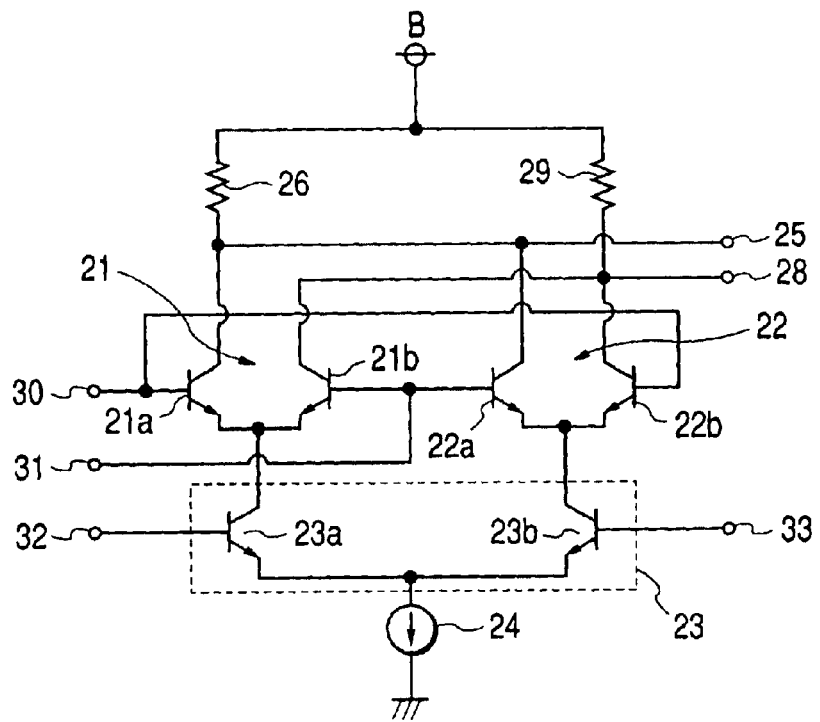
FIG. 3 is a circuit diagram showing a conventional mixer.
Figure 4:
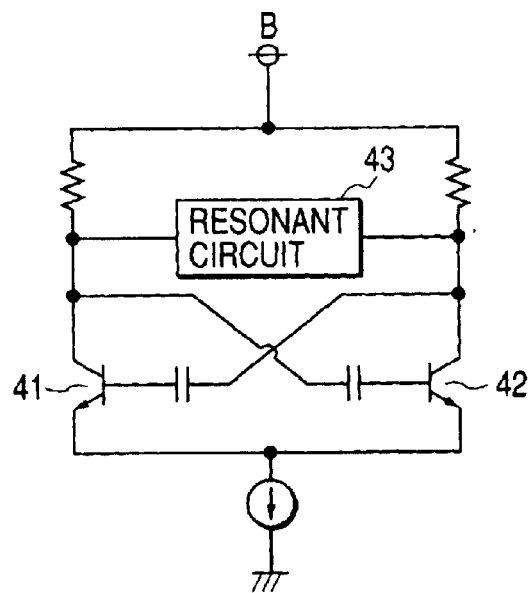
FIG. 4 is a circuit diagram showing an oscillation circuit used in the conventional mixer.

In the circuit as shown in FIG. 2 according to the second embodiment of the present invention, the emitter of a first transistor 1 and the emitter of a second transistor 2 are connected with each other and also both connected with a constant current source 3 or the like. A composite resonant circuit 14 which has two parallel resonance frequencies is connected between the collector and base of each of the transistors 1 and 2.

The emitter and collector of the first transistor 1 are connected with the emitter and collector of the third transistor 7 respectively and the emitter and collector of the second transistor 2 are connected with the emitter and collector of the fourth transistor 8 respectively. The base of the third transistor 7 is connected with one balanced input terminal 9 and the base of the fourth transistor 8 is connected with the other balanced input terminal 10.

As illustrated in FIG. 2, the composite resonant circuit 14 includes a first capacitor 14a; a serial circuit which has a second capacitor 14b, a first inductor 14c and a second inductor 14d and is connected in parallel with the first capacitor 14a with the second capacitor 14b located between the first and second inductors 14c and 14d; and a third inductor 14e and a fourth inductor 14f which are serially connected with each other and connected in parallel with the second capacitor 14b.

The point of connection between the first capacitor 14a and the first inductor 14c is connected with the collector of the first transistor 1 and also with the base of the second transistor 2 through a coupling capacitor 6. Also, the point of connection between the first capacitor 14a and the second inductor 14d is connected with the collector of the second transistor 2 and also with the base of the first transistor 1 through a coupling capacitor 5. Supply voltage B applied to the point of connection between the third and fourth inductors 14e and 14f is fed to the collectors of the first to fourth transistors 1, 2, 7 and 8. One end of the second capacitor 14b is connected with one balanced output terminal 12 and its other end is connected with the other balanced output terminal 13.

In the above composite resonant circuit 14, the first inductor 14c and the second inductor 14d are almost equal in inductance; and the third inductor 14e and the fourth inductor 14f are almost equal in inductance. The inductance of the third and fourth inductors 14e and 14f is larger than that of the first and second inductors 14c and 14d. The capacitance of the second capacitor 14b is larger than that of the first capacitor 14a. Hence, the composite resonant circuit 14 has the following two parallel resonance frequency circuits: a third parallel resonant circuit whose parallel resonance frequency is virtually determined by the first and second capacitors 14a and 14b, and the first and second inductors 14c and 14d; and a fourth parallel resonant circuit whose parallel resonance frequency is virtually determined by the second capacitor 14b and the third and fourth inductors 14e and 14f.

Accordingly, the third parallel resonant circuit and the first and second transistors 1 and 2 make up a balanced oscillation circuit where oscillation occurs at a frequency in the vicinity of its parallel resonance frequency. The third transistor 7 is excited by the oscillation signal through the first transistor 1 whose emitter is connected with the emitter of the third transistor 7; and also the fourth transistor 8 is excited by the oscillation signal through the second transistor 2 whose emitter is connected with the emitter of the fourth transistor 8.

A first signal, for example, a high frequency signal to be frequency converted, is inputted between the balanced input terminals 9 and 10. As a result, the third transistor 7 and the fourth transistor 8 operate differentially. Also, the first transistor 1 and the second transistor 2, which constitute a balanced oscillation circuit, operate differentially. The emitter of the third transistor 7 and the emitter of the fourth transistor 8 are excited in reverse phases by an oscillation signal. Hence, in the third transistor 7 and the fourth transistor 8, the oscillation signal and the first signal are mixed and, for example, a second signal whose frequency is the difference between the frequencies of the oscillation and first signals, namely an intermediate frequency signal, is generated. Hence, the oscillation signal and the second signal appear at the collectors of the first and third transistors 1 and 7 and the collectors of the second and fourth transistors 2 and 8. When the resonance frequency of the fourth parallel resonant circuit is set to the value of the above difference, an intermediate frequency signal as the second signal is efficiently outputted from the balanced output terminals 12 and 13 in a balanced way, with the oscillation signal suppressed.

In the above configuration, supply voltage B is fed in parallel to the two transistors 1 and 2, which constitute a balanced oscillation circuit, and the two transistors 7 and 8, which mix signals and thus the mixer operates satisfactorily even at low voltage.

As explained so far, the present invention provides a mixer comprising: a first and a second transistor which constitute a balanced oscillation circuit with their respective emitters connected with each other; a third transistor whose emitter is connected with the emitter of the first transistor; and a fourth transistor whose emitter is connected with the emitter of the second transistor, wherein a first signal is inputted between the base of the third transistor and the base of the fourth transistor in a balanced way; and the third transistor and the fourth transistor mix an oscillation signal with the first signal and a second signal is outputted from the third transistor and the fourth transistor in a balanced way. Therefore, supply voltage can be fed in parallel to the first and second transistors for oscillation and the third and fourth transistors for mixing, which means that the mixer can operate even at low voltage without deterioration in the performance of the transistors. Also, since the required number of transistors is decreased, the structure of the mixer can be simplified.

In addition, the mixer has a first parallel resonant circuit which determines the oscillation frequency and a second parallel resonant circuit which resonates with the second signal; and the first parallel resonant circuit is connected between the collector and base of each of the first and second transistors and the second parallel resonant circuit is connected between the collector of the third transistor and the collector of the fourth transistor. Therefore, the parallel resonant circuit for oscillation and the one for the second signal are separated and the configurations of the resonant circuits can be simplified. In addition, only the second signal is outputted from the third and fourth transistors.

Furthermore, in the first parallel resonant circuit, the point of connection between the first capacitor and the first inductor is connected with the collector of the first transistor and the point of connection between the first capacitor and the second inductor is connected with the collector of the second transistor. In the second parallel resonant circuit, the point of connection between the second capacitor and the third inductor is connected with the collector of the third transistor and the point of connection between the second capacitor and the fourth inductor is connected with the collector of the fourth transistor. Here, supply voltage is fed to the point of connection between the first inductor and the second inductor and the point of connection between the third inductor and the fourth inductor. Therefore, supply voltage is fed in parallel to the collectors of the first to fourth transistors.

Also, the collector of the first transistor and the collector of the third transistor are connected with each other and the collector of the second transistor and the collector of the fourth transistor are connected with each other; and the composite resonant circuit is connected between the collectors of the first and third transistors and the base of the second transistor and also between the collectors of the second and fourth transistors and the base of the first transistor. Therefore, with the composite resonant circuit, the oscillation frequency is determined and tuning with the second signal can be done.

In the composite resonant circuit, the first and second capacitors and the first and second inductors generate parallel resonance in the vicinity of the oscillation frequency, and the second capacitor and the third and fourth inductors generate parallel resonance in the vicinity of the second signal frequency; the point of connection between the first capacitor and the first inductor is connected with the collectors of the first and third transistors and the point of connection between the first capacitor and the second inductor is connected with the collectors of the second and fourth transistors; and supply voltage is fed to the point of connection between the third and fourth inductors. Therefore, supply voltage is fed in parallel to the first to fourth transistors.

Also, the second signal is outputted from both ends of the second capacitor, so the oscillation signal which is contained in the second signal is suppressed.

What is claimed is:

1. A mixer comprising:
    first and second transistors which constitute a balanced oscillation circuit with their respective emitters connected with each other;
    a third transistor whose emitter is connected with the emitter of the first transistor; and
    a fourth transistor whose emitter is connected with the emitter of the second transistor wherein
    a first signal is inputted between a base of the third transistor and a base of the fourth transistor in a balanced way;
    wherein the third transistor and the fourth transistor mix an oscillation signal with the first signal; and
    wherein a second signal is outputted from the third transistor and the fourth transistor in a balanced way.

2. The mixer according to claim 1, wherein
    there are a first parallel resonant circuit which determines an oscillation frequency and a second parallel resonant circuit which resonates with the second signal;
    wherein the first parallel resonant circuit is connected between a collector and a base of each of the first and second transistors; and
    wherein the second parallel resonant circuit is connected between a collector of the third transistor and a collector of the fourth transistor.

3. The mixer according to claim 2, wherein
    the first parallel resonant circuit comprises a first capacitor, and first and second inductors which are serially connected with each other and connected in parallel with the first capacitor;
    wherein a point of connection between the first capacitor and the first inductor is connected with the collector of the first transistor;
    wherein a point of connection between the first capacitor and the second inductor is connected with the collector of the second transistor;
    wherein the second parallel resonant circuit comprises a second capacitor, and third and fourth inductors which are serially connected with each other and connected in parallel with the second capacitor;
    wherein a point of connection between the second capacitor and the third inductor is connected with the collector of the third transistor;
    wherein a point of connection between the second capacitor and the fourth inductor is connected with the collector of the fourth transistor; and
    wherein supply voltage is fed to a point of connection between the first inductor and the second inductor and a point of connection between the third inductor and the fourth inductor.

4. The mixer according to claim 1, wherein
    there is a composite resonant circuit which has parallel resonance frequencies in the respective vicinities of an oscillation frequency and the second signal;
    wherein a collector of the first transistor and a collector of the third transistor are connected with each other;
    wherein a collector of the second transistor and a collector of the fourth transistor are connected with each other; and
    wherein the composite resonant circuit is connected between the collectors of the first and third transistors and a base of the second transistor as well as between the collectors of the second and fourth transistors and a base of the first transistor.

5. The mixer according to claim 4, wherein the composite resonant circuit comprises:
    a first capacitor;
    a serial circuit which contains a second capacitor and first and second inductors and is connected in parallel with the first capacitor with the second capacitor located between the first and second inductors; and
    third and fourth inductors which are serially connected with each other and connected in parallel with the second capacitor;
    wherein the first and second capacitors and the first and second inductors generate parallel resonance in the vicinity of the oscillation frequency;
    wherein the second capacitor and the third and fourth inductors generate parallel resonance in the vicinity of the second signal frequency;
    wherein a point of connection between the first capacitor and the first inductor is connected with the collectors of the first and third transistors;
    wherein the point of connection between the first capacitor and the second inductor is connected with the collectors of the second and fourth transistors; and
    wherein supply voltage is fed to a point of connection between the third and fourth inductors.

6. The mixer according to claim 5, wherein the second signal is outputted from both ends of the second capacitor.

* * * * *

UNITED STATES PATENT AND TRADEMARK OFFICE
CERTIFICATE OF CORRECTION

PATENT NO. : 6,828,844 B2
DATED : December 7, 2004
INVENTOR(S) : Takeo Suzuki et al.

It is certified that error appears in the above-identified patent and that said Letters Patent is hereby corrected as shown below:

Column 7,
Line 32, immediately after "second transistor" insert -- , -- (comma).

Signed and Sealed this

Twenty-third Day of August, 2005

JON W. DUDAS
*Director of the United States Patent and Trademark Office*